(12) United States Patent
Chen (10) Patent No.: US 9,634,661 B1
(45) Date of Patent: Apr. 25, 2017

(54) OPTICAL SWITCH KEYBOARD

(71) Applicant: Primax Electronics Ltd., Neihu, Taipei (TW)

(72) Inventor: Chung-Yuan Chen, Taipei (TW)

(73) Assignee: PRIMAX ELECTRONICS LTD., Taipei (TW)

( * ) Notice: Subject to any disclaimer, the term of this patent is extended or adjusted under 35 U.S.C. 154(b) by 0 days.

(21) Appl. No.: 15/157,186

(22) Filed: May 17, 2016

Related U.S. Application Data (60) Provisional application No. 62/267,075, filed on Dec. 14, 2015.

(30) Foreign Application Priority Data

Apr. 8, 2016 (TW) .............................. 105111062 A (51) Int. Cl.
*H03K 17/96* (2006.01)
*H03K 17/969* (2006.01)

(52) U.S. Cl.
CPC .................................. *H03K 17/969* (2013.01)

(58) Field of Classification Search
CPC combination set(s) only.
See application file for complete search history.

(56) References Cited

U.S. PATENT DOCUMENTS 7,283,066 B2 * 10/2007 Shipman ............... G06F 3/0202
                                                             200/319
7,294,803 B2 * 11/2007 Lee ........................ H01H 13/83
                                                             200/314

* cited by examiner

*Primary Examiner* — Kabir A Timory
(74) *Attorney, Agent, or Firm* — Kirton McConkie; Evan R. Witt

(57) ABSTRACT

An optical switch keyboard includes a circuit module and plural keys. The circuit module includes a circuit board, plural light emitters, plural light receivers and plural light sources. Each key corresponds to a light emitter, a light receiver and a light source. The plural light emitters and the plural light receivers are disposed under the circuit board. Consequently, the plural light emitters and the plural light receivers are not interfered by the ambient light that comes from the top side of the circuit board. In case that the light sources are disposed over the circuit board, the light beams from the light sources are transmitted upwardly through light-transmissible triggering elements of the corresponding keys and projected to the keycaps. Consequently, a visual effect is generated.

11 Claims, 11 Drawing Sheets

OPTICAL SWITCH KEYBOARD

FIELD OF THE INVENTION

The present invention relates to a keyboard, and more particularly to a keyboard with optical switches.

BACKGROUND OF THE INVENTION

A keyboard is an essential input device of a computer system. The keyboard is equipped with many keys. By depressing a key of the keyboard, a command is inputted into the computer system. Conventionally, many kinds of keys are designed to generate key signals. For example, a mechanical key uses a conductive pin to trigger a circuit switch to generate a key signal. In addition, an optical key generates a key signal according to the result of receiving or obstructing a sensing light.

Figure 1:
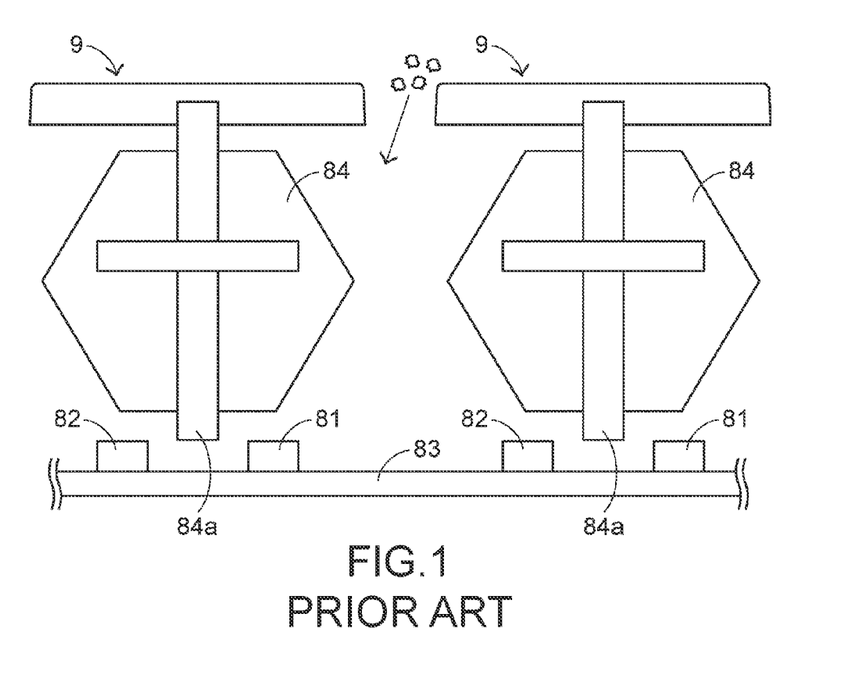
FIG. 1 is a schematic view illustrating the structure of a conventional optical switch.

FIG. 1 is a schematic view illustrating the structure of a conventional optical switch 9. As shown in FIG. 1, a key part 84 is disposed over a circuit board 83. The key part 84 can be pressed by a user. A light emitter 81 and a light receiver 82 for generating a conducting signal are opposed to each other. Moreover, the light emitter 81 and the light receiver 82 are arranged between the key part 84 and the circuit board 83. While the key part 84 is depressed, a shield arm 84a of the key part 84 is inserted into the space between the light emitter 81 and the light receiver 82 to obstruct the optical path between the light emitter 81 and the light receiver 82. Meanwhile, the sensing light from the light emitter 81 cannot be received by the light receiver 82, and thus the optical switch 9 generates a triggering signal.

However, the conventional optical switch 9 still has some drawbacks. As shown in FIG. 1, the light emitter 81, the light receiver 82 and the key part 84 are arranged at the same side of the circuit board 83. That is, all of the key part 84, the light emitter 81 and the light receiver 82 are disposed over the circuit board 83. Moreover, there is a gap between every two adjacent key parts 84. Generally, dust or liquid easily flies or permeates into the gap between the adjacent key parts 84 and stays on the circuit board 83. Because of the interference of dust or liquid, the sensing light from the light emitter 81 cannot be precisely received by the light receiver 82. Under this circumstance, a misjudgment problem occurs, and the precision of the optical switch is deteriorated. Therefore, the conventional optical switch needs to be further improved.

SUMMARY OF THE INVENTION

The present invention provides an optical switch keyboard. A light emitter and a light receiver for generating a conducting signal are disposed under the circuit board. A key is disposed over the circuit board. By this design, the light receiver is not interfered by foreign matters or ambient light. Consequently, the judging sensitivity and the accuracy of the optical key are both increased.

In accordance with an aspect of the present invention, there is provided an optical switch keyboard. The optical switch keyboard includes a circuit module and plural keys. The circuit module includes a circuit board, plural light emitters, plural light receivers and plural light source. The plural light emitters are disposed on a bottom surface of the circuit board. Each of the plural light emitters emits a sensing light. The plural light receivers correspond to the plural light emitters, respectively. The plural light receivers are disposed on the bottom surface of the circuit board. When the light receiver receives the sensing light from the corresponding light emitter, the light receiver generates a corresponding conducting signal. The plural light sources are disposed on the circuit board and electrically connected with the circuit board. The plural keys correspond to the plural light emitters, the plural light receivers and the plural light sources, respectively. The plural keys are disposed on the top surface of the circuit board. Each of the plural keys includes a keycap, housing and a triggering element. The housing is disposed under the keycap. The triggering element is connected with the keycap and penetrating into the housing. The triggering element has a light-transmissible zone. After the light beam from the each light source is transmitted through the light-transmissible zone of the triggering element, the light beam is irradiated on a bottom surface of the keycap. The sensing light from the light emitter is received by the light receiver when the triggering element is in a first position. The sensing light from the light emitter is not received by the light receiver when the triggering element is in a second position. The circuit board generates a corresponding triggering signal according to a status change of the conducting signal.

In an embodiment, the optical switch keyboard further includes a keyboard base under the circuit module, and the keyboard base includes plural light-shading walls. An accommodation space is defined by the corresponding light-shading wall to accommodate the corresponding light emitter and the corresponding light receiver. The light emitter and the light receiver are shaded from ambient light by the corresponding light-shading wall. The light emitter and the light receiver are in communication with the circuit board.

In an embodiment, the circuit board includes plural perforations under the corresponding keys, and the triggering element has a light obstructing part. When the triggering element is moved downwardly, the light obstructing part is protruded through the corresponding perforation to be in an optical path of the sensing light from the light emitter.

In an embodiment, when the triggering element is in the first position, the sensing light from the light emitter is received by the light receiver. When the triggering element is in the second position, the light obstructing part is protruded through the corresponding perforation to be in the optical path of the sensing light from the light emitter, so that the sensing light from the light emitter is obstructed by the light obstructing part and not received by the light receiver.

In an embodiment, the light obstructing part has a reflective surface. When the triggering element is in the second position, the sensing light from the light emitter is not received by the light receiver. When the triggering element is in the first position, the light obstructing part is protruded through the corresponding perforation to be in the optical path of the sensing light from the light emitter, so that the sensing light from the light emitter is reflected to the light receiver by the reflective surface.

In an embodiment, each key further includes an elastic element. A first end of the elastic element is contacted with the triggering element. A second end of the elastic element is contacted with the housing. When the keycap is depressed, the triggering element is moved downwardly to the second position. When the keycap is released, the triggering element is returned to the first position in response to an elastic force of the elastic element.

In an embodiment, the elastic element is sheathed around a part of the triggering element, and the light source is received in the second end of the elastic element. The light beam from the light source is transmitted upwardly through the light-transmissible zone of the triggering element.

In an embodiment, the circuit board further includes plural diffusion lenses that cover the corresponding light sources. After the light beam from the light source passes through the corresponding diffusion lens, the light beam is uniformly diffused.

In an embodiment, the key includes at least one positioning post, and the circuit board has plural positioning holes. Each key is disposed over the corresponding at least one positioning hole. When the at least one positioning post of the key is inserted into the corresponding at least one positioning hole of the circuit board, the key is fixed on the circuit board.

In an embodiment, each key further includes a spring strip, and the spring strip is accommodated within the housing. When the keycap is depressed and the triggering element is moved downwardly, the spring strip is activated to generate a feedback sound and a tactile feel.

In an embodiment, the light sources are disposed on the top surface of the circuit board, or the light sources are disposed on the bottom surface of the circuit board.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

Figure 2:
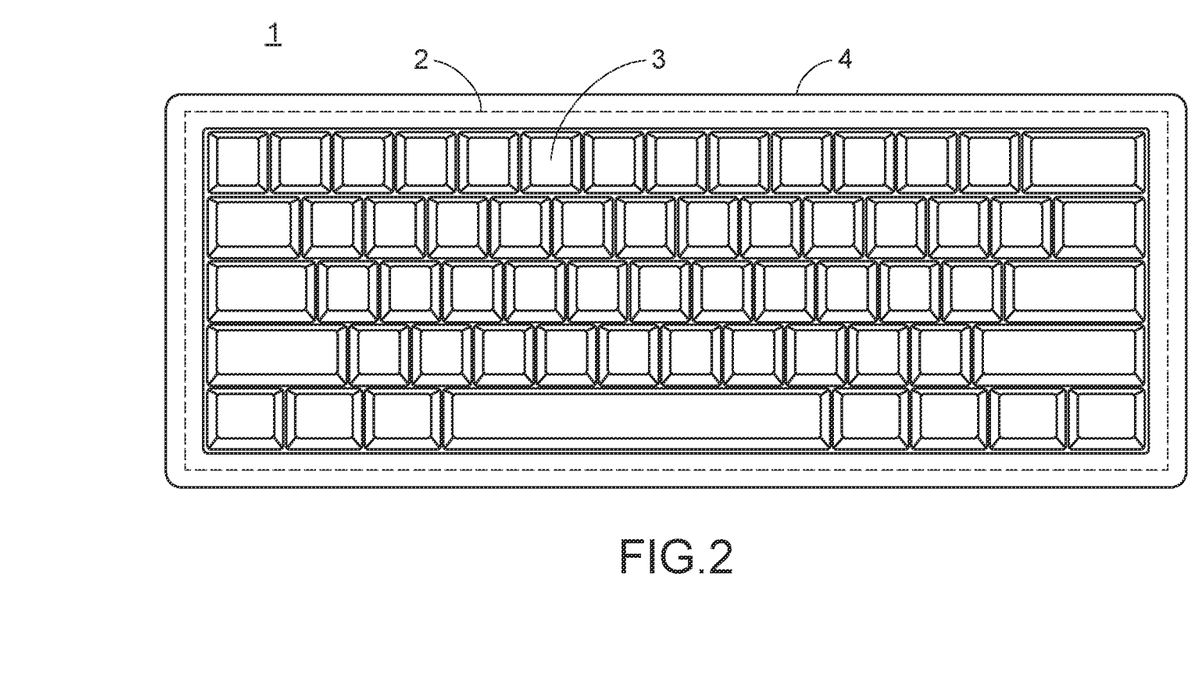
FIG. 2 is a schematic top view illustrating an optical switch keyboard according to an embodiment of the present invention.

FIG. 2 is a schematic top view illustrating an optical switch keyboard according to an embodiment of the present invention. As shown in FIG. 2, the optical switch keyboard 1 comprises a circuit module 2, plural keys 3 and an outer shell 4. The plural keys 3 are disposed on the circuit module 2. Moreover, plural optical switches are defined by the plural keys 3 and the circuit module 2 collaboratively. The periphery of the circuit module 2 is covered by the outer shell 4, and the plural keys 3 are enclosed by the outer shell 4. Consequently, the outer appearance of the optical switch keyboard is constructed.

Figure 3:
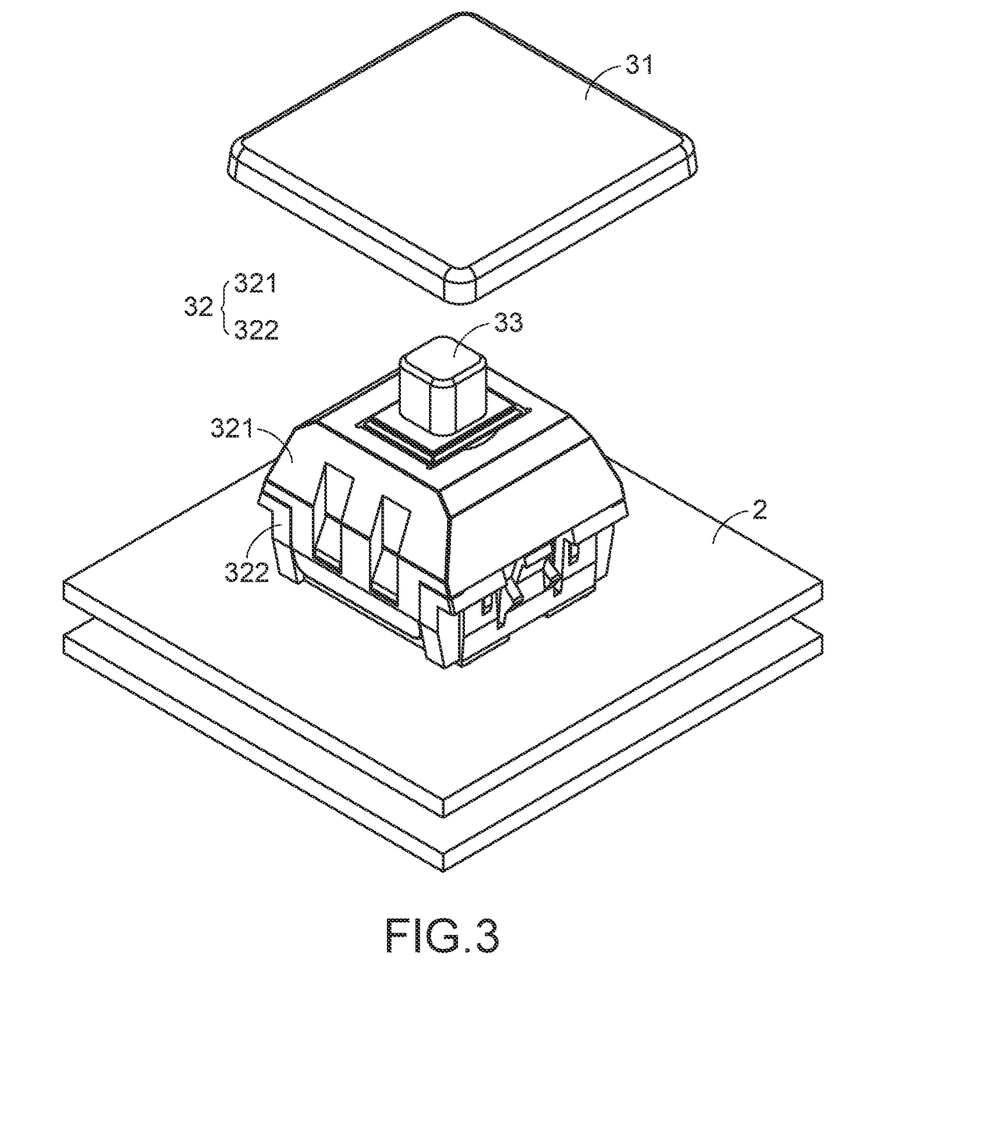
FIG. 3 is a schematic perspective view illustrating a single optical switch of the optical switch keyboard according to a first embodiment of the present invention.
Figure 4:
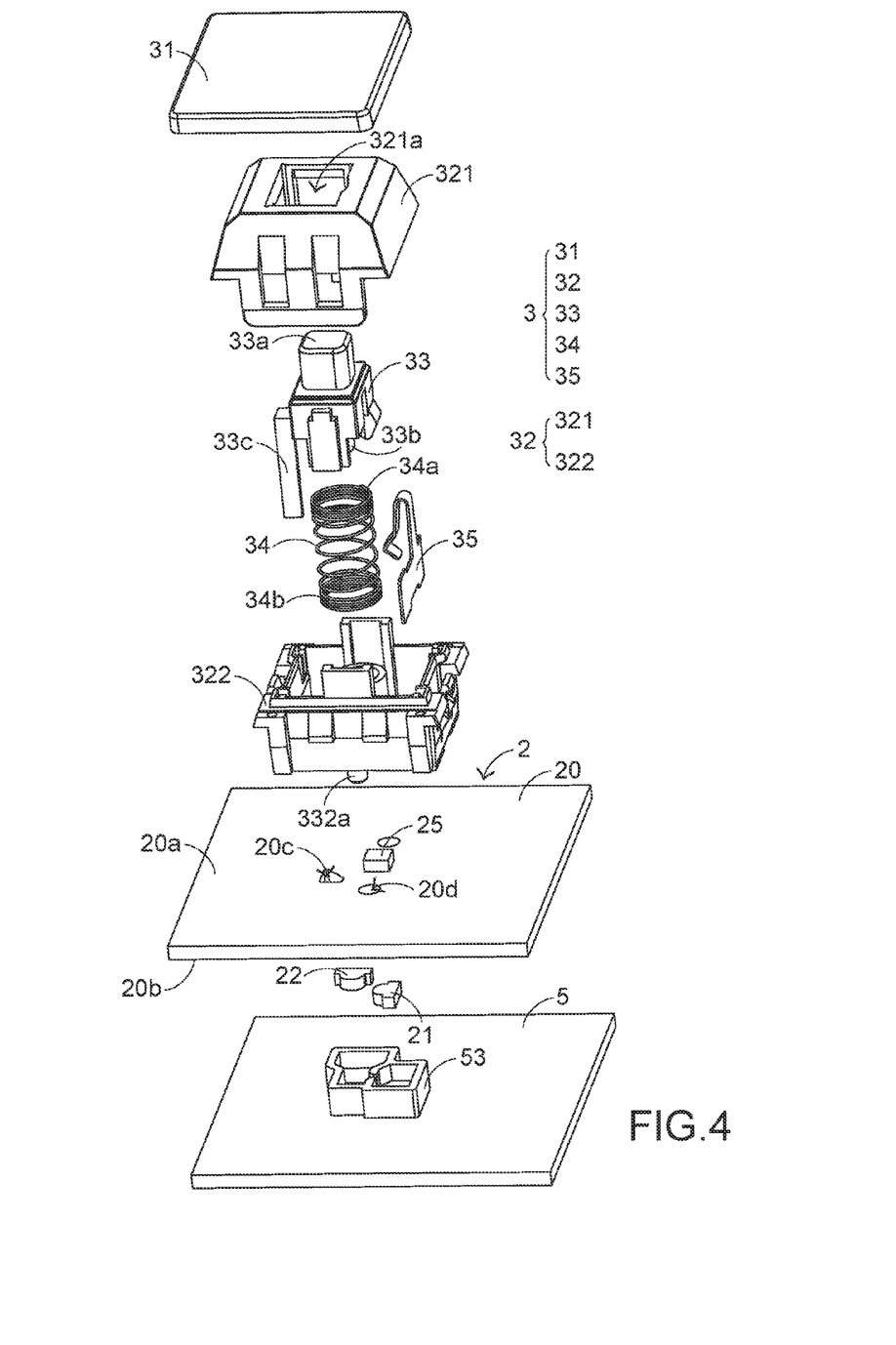
FIG. 4 is a schematic exploded view illustrating the optical switch of the optical switch keyboard according to the embodiment of the present invention.

For succinctness, only a single optical switch is shown in FIGS. 3 and 4. FIG. 3 is a schematic perspective view illustrating a single optical switch of the optical switch keyboard according to a first embodiment of the present invention. FIG. 4 is a schematic exploded view illustrating the optical switch of the optical switch keyboard according to the first embodiment of the present invention. As shown in FIGS. 3 and 4, the key 3 comprises a keycap 31, a housing assembly 32, a triggering element 33, an elastic element 34 and a spring strip 35. The keycap 31 is located at the outermost position of the key 3. In a normal placement of the keyboard, the keycap 31 is at the topmost side to be depressed by the user. The housing assembly 32 is disposed under the keycap 31. The housing assembly 32 is arranged between the keycap 31 and the circuit module 2. The housing assembly 32 comprises an upper housing 321 and a lower housing 322. Since the upper housing 321 and the lower housing 322 are detachably coupled with each other, the triggering element 33, the elastic element 34 and the spring strip 35 can be accommodated within the space between the upper housing 321 and the lower housing 322 during the process of assembling the key 3.

The associated structures for combining the key 3 with a circuit board 20 of the circuit module 2 will be illustrated as follows. Each lower housing 322 has a positioning post 322a. The circuit board 20 has plural positioning holes 20d. Each key 3 is disposed over the corresponding positioning hole 20d. When the positioning post 322a of each key 3 is inserted into the corresponding positioning hole 20d of the circuit board 20, the key 3 is fixed on the circuit board 20. It is noted that the number of the positioning posts is not restricted. For example, in another embodiment, each key 3 has two positioning post 322a, which are respectively inserted into the corresponding positioning holes 20d of the circuit board 20. While the keycap 31 is pressed down by the user and the triggering element 33 is correspondingly moved downwardly, the spring strip 35 is activated to generate a feedback sound. Due to the feedback sound, the visual effect of depressing the keycap and the tactile feel are both enhanced.

Moreover, the triggering element 33 is accommodated within the housing assembly 32. The triggering element 33 has a first end 33a and a second end 33b, which are opposed to each other. The first end 33a of the triggering element 33 is protruded out of the upper housing 321 through an upper opening 321a and fixed on a bottom surface of the keycap 31. The elastic element 34 is sheathed around a part of the triggering element 33. The second end 33b of the triggering element 33 is contacted with the elastic element 34. A first end 34a of the elastic element 34 is contacted with the triggering element 33. A second end 34b of the elastic element 34 is contacted with the lower housing 322. While the keycap 31 is moved downwardly in response to the depressing force of the user, the triggering element 33 is moved toward the circuit module 2 in response to the force. Since the elastic element 34 is compressed by the triggering element 33, elastic potential energy is stored in the elastic element 34. Before the keycap 31 is depressed, the keycap 31 and the triggering element 33 are in a non-depressed position (see FIG. 5). After the keycap 31 is depressed, the keycap 31 and the triggering element 33 are moved downwardly to a depressed position (see FIG. 7) in response to the force. When the key 3 is released by the user, the elastic potential energy in the elastic element 34 is gradually released and thus the keycap 31 and the triggering element 33 are returned to the non-depressed position. The action of depressing the key 3 and the action of returning the key 3 have been mentioned as above.

The structure of the circuit module 2 will be illustrated in more details as follows. Please refer to FIG. 4 again. The circuit module 2 comprises the circuit board 20, plural light emitters 21, plural light receivers 22 and plural light sources 25. The keys 3 are disposed over the circuit board 20. The light emitters 21 and the light receivers 22 are disposed under the circuit board 20. Preferably, the keys 3 are disposed on a top surface 20a of the circuit board 20, and the light emitters 21 and the light receivers 22 are disposed on a bottom surface 20b of the circuit board 20. Moreover, the light sources 25 are disposed on the top surface 20a or the bottom surface 20b of the circuit board 20. In case that the light sources 25 are disposed on the bottom surface 20b of the circuit board 20, the circuit board 20 comprises light-transmissible openings (not shown) corresponding to the light sources 25. Consequently, the light beams emitted by the light sources are transmitted upwardly through the corresponding light-transmissible openings of the circuit board 20 and propagated in a direction away from the circuit board 20. Moreover, the light emitter 21 emits a sensing light. When the sensing light is received by the corresponding light receiver 22, a conducting signal is generated. Moreover, the circuit board 20 has plural perforations 20c. While a keycap 31 is depressed, the corresponding triggering element 33 is protruded downwardly through the corresponding perforation 20c to the position under the circuit board 20. Under this circumstance, the sensing light from the light emitter 21 can be received by the light receiver 22.

Moreover, each triggering element 33 comprises a light obstructing part 33c. Since the key 3 is disposed over the corresponding perforation 20c, the light obstructing part 33c is aligned with the corresponding perforation 20c. While the keycap 31 is depressed and the corresponding triggering element 33 is moved downwardly, the light obstructing part 33c is protruded downwardly through the corresponding perforation 20c to the position under the circuit board 20 and the light obstructing part 33c is in an optical path of the sensing light from the light emitter 21.

Figure 5:
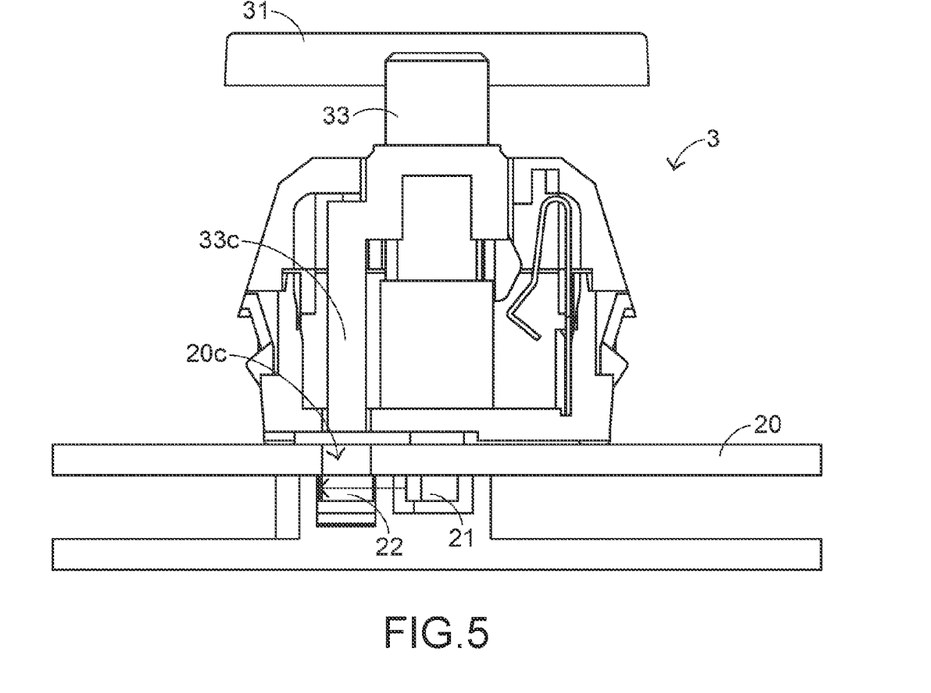
FIG. 5 is a schematic cross-sectional view illustrating the optical switch according to the first embodiment of the present invention and taken along a first direction, in which the key is not depressed and the triggering element is in a non-depressed position.
Figure 6:
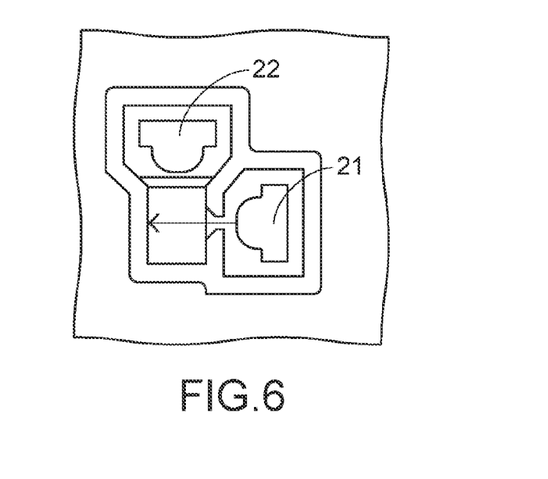
FIG. 6 is a schematic cross-sectional view illustrating the optical switch according to the first embodiment of the present invention and taken along a second direction, in which the key is not depressed and the triggering element is in the non-depressed position.
Figure 7:
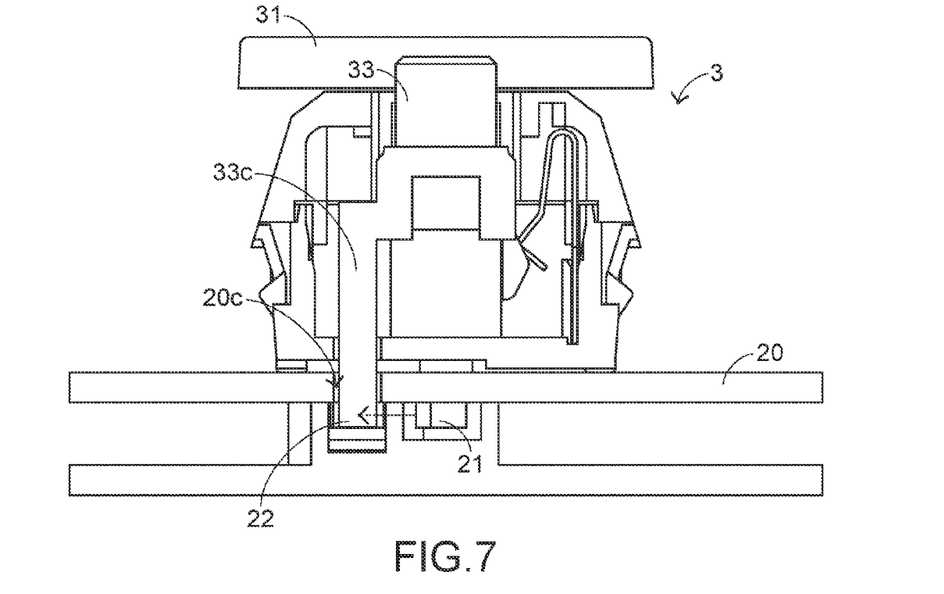
FIG. 7 is a schematic cross-sectional view illustrating the optical switch according to the first embodiment of the present invention and taken along the first direction, in which the key is depressed and the triggering element is in a depressed position.
Figure 8:
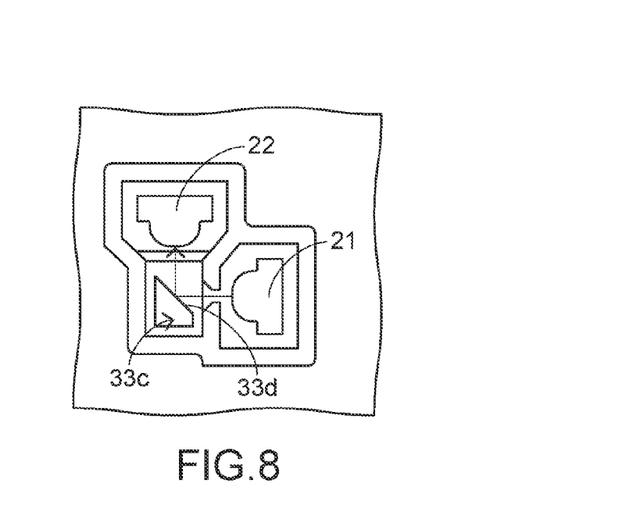
FIG. 8 is a schematic cross-sectional view illustrating the optical switch according to the first embodiment of the present invention and taken along the second direction, in which the key is depressed and the triggering element is in the depressed position.

The operations of the light emitter 21 and the light receiver 22 will be illustrated with reference to FIGS. 5~8. FIG. 5 is a schematic cross-sectional view illustrating the optical switch according to the first embodiment of the present invention and taken along a first direction, in which the key is not depressed and the triggering element is in a non-depressed position. FIG. 6 is a schematic cross-sectional view illustrating the optical switch according to the first embodiment of the present invention and taken along a second direction, in which the key is not depressed and the triggering element is in the non-depressed position. FIG. 7 is a schematic cross-sectional view illustrating the optical switch according to the first embodiment of the present invention and taken along the first direction, in which the key is depressed and the triggering element is in a depressed position. FIG. 8 is a schematic cross-sectional view illustrating the optical switch according to the first embodiment of the present invention and taken along the second direction, in which the key is depressed and the triggering element is in the depressed position. In this embodiment, a light-outputting direction of the light emitter 21 and a light-inputting direction of the light receiver 22 are not linearly aligned with each other (see FIGS. 6 and 8). That is, the light-outputting direction of the light emitter 21 is perpendicular to the light-inputting direction of the light receiver 22. The way of generating the conducting signal will be illustrated as follows. The light obstructing part 33c has a reflective surface 33d. The angle between the reflective surface 33d and the light-outputting direction of the light emitter 21 and the angle between the reflective surface 33d and the light-inputting direction of the light receiver 22 are both 45 degrees substantially. When the key 3 is not depressed and the triggering element 33 is in the non-depressed position, the triggering element 33 is not moved downwardly to the same level as the light emitter 21 and the light receiver 22. Under this circumstance, the sensing light from the light emitter 21 cannot be transmitted to the light receiver 22 (see FIGS. 5 and 6). After the key 3 is depressed and the triggering element 33 is in the depressed position, the light obstructing part 33c is protruded downwardly through the corresponding perforation 20c to the same level as the light emitter 21 and the light receiver 22. That is, the light obstructing part 33c is protruded to a position in the optical path of the sensing light from the light emitter 21. After the sensing light from the light emitter 21 is irradiated on the reflective surface 33d of the light obstructing part 33c, the direction of the optical path is changed to the light receiver 22. After the sensing light is received by the light receiver 22 (see FIG. 8), the light receivers 22 generates the conducting signal. According to a change of the conducting signal from an interrupted status to a generated status, the circuit board 20 generates a corresponding triggering signal.

Figure 9:
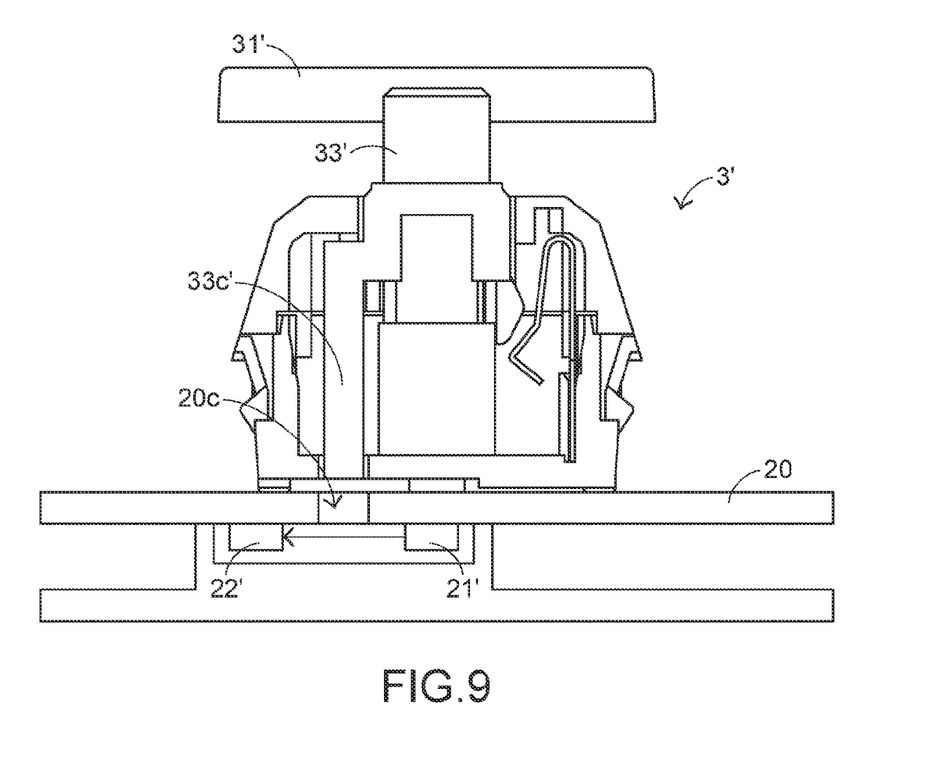
FIG. 9 is a schematic cross-sectional view illustrating an optical switch according to a second embodiment of the present invention, in which the key is not depressed and the triggering element is in a non-depressed position.
Figure 10:
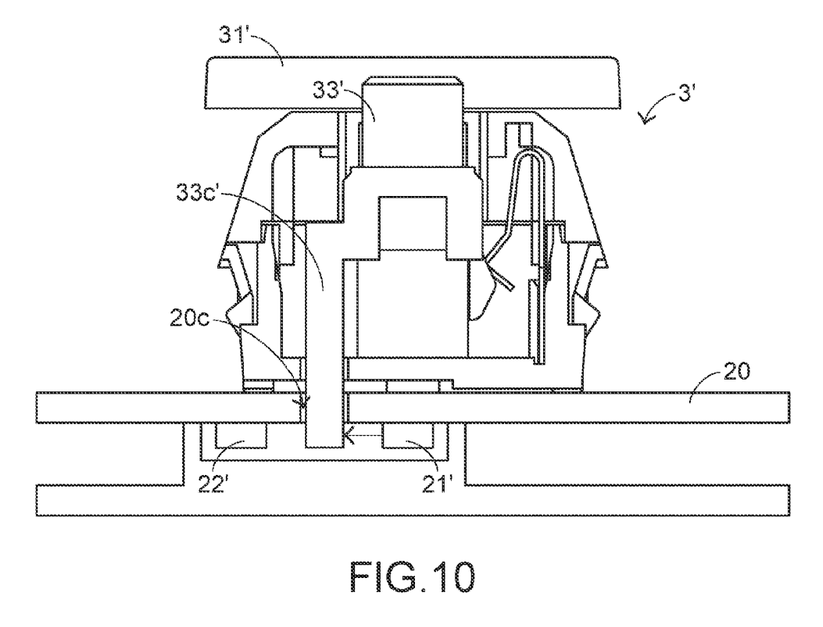
FIG. 10 is a schematic cross-sectional view illustrating an optical switch according to the second embodiment of the present invention, in which the key is depressed and the triggering element is in a depressed position.

It is noted that the positions of the light emitter 21 and the light receiver 22 are not restricted. FIG. 9 is a schematic cross-sectional view illustrating an optical switch according to a second embodiment of the present invention, in which the key is not depressed and the triggering element is in a non-depressed position. FIG. 10 is a schematic cross-sectional view illustrating an optical switch according to the second embodiment of the present invention, in which the key is depressed and the triggering element is in a depressed position. In this embodiment, a light-outputting direction of the light emitter 21' and a light-inputting direction of the light receiver 22' are linearly aligned with each other. Moreover, the light obstructing part 33c' is used for obstructing the sensing light. When the key 3' is not depressed and the triggering element 33' is in the non-depressed position, the triggering element 33' is not moved downwardly to the same level as the light emitter 21' and the light receiver 22'. Under this circumstance, the sensing light from the light emitter 21' can be transmitted to the light receiver 22'. After the key 3' is depressed and the triggering element 33' is in the depressed position, the light obstructing part 33c' is protruded downwardly through the corresponding perforation 20c to the same level as the light emitter 21' and the light receiver 22'. That is, the light obstructing part 33c' is protruded to a position in the optical path of the sensing light from the light emitter 21'. Since the sensing light from the light emitter 21' is obstructed by the light obstructing part 33c', the sensing light cannot be received by the light receiver 22'. Consequently, the conducting signal is interrupted. According to a change of the conducting signal from a generated status to an interrupted status, the circuit board 20 generates a corresponding triggering signal.

Figure 11:
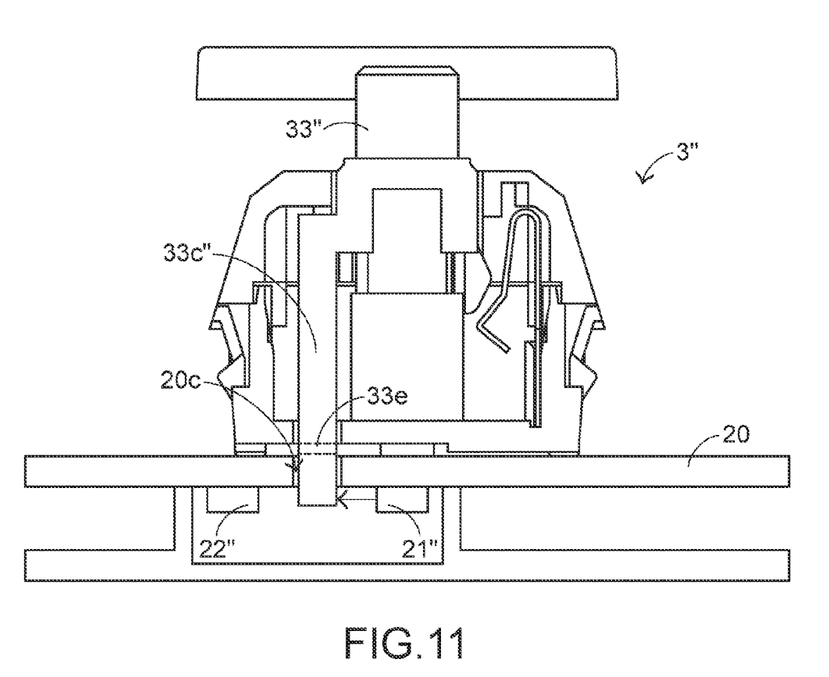
FIG. 11 is a schematic cross-sectional view illustrating an optical switch according to a third embodiment of the present invention, in which the key is not depressed and the triggering element is in a non-depressed position.
Figure 12:
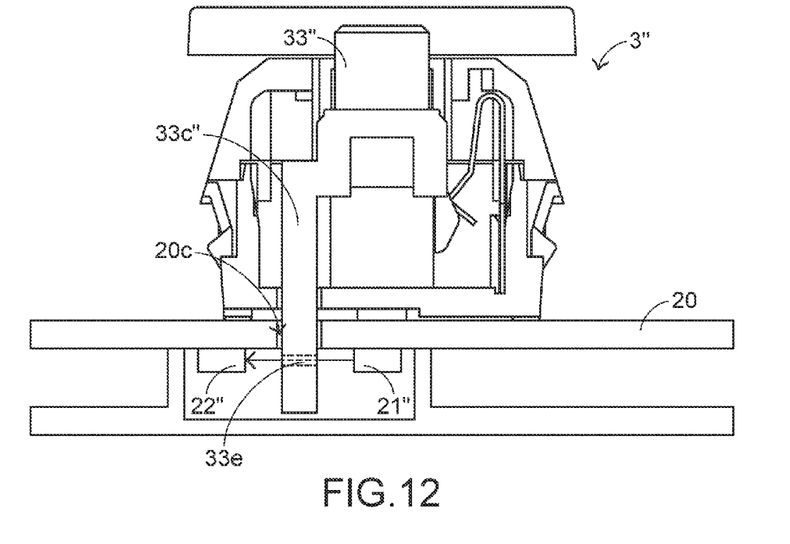
FIG. 12 is a schematic cross-sectional view illustrating an optical switch according to a third embodiment of the present invention, in which the key is depressed and the triggering element is in a depressed position.

FIG. 11 is a schematic cross-sectional view illustrating an optical switch according to a third embodiment of the present invention, in which the key is not depressed and the triggering element is in a non-depressed position. FIG. 12 is a schematic cross-sectional view illustrating an optical switch according to a third embodiment of the present invention, in which the key is depressed and the triggering element is in a depressed position. The components and associated structures of the optical switch of this embodiment are similar to those of the second embodiment. In this embodiment, a light-outputting direction of the light emitter 21" and a light-inputting direction of the light receiver 22" are linearly aligned with each other. The light obstructing part 33c" is used for obstructing the sensing light. Moreover, the light obstructing part 33c" has a light-transmissible aperture 33e. When the key 3" is not depressed and the triggering element 33" is in the non-depressed position, the triggering element 33" is at the same level as the light emitter 21" and the light receiver 22". Under this circumstance, the sensing light from the light emitter 21" is obstructed by the light obstructing part 33c", and thus cannot be transmitted to the light receiver 22". After the key 3" is depressed and the triggering element 33" is in the depressed position, the light obstructing part 33c" is protruded downwardly through the corresponding perforation 20c to the same level as the light emitter 21" and the light receiver 22". That is, the light obstructing part 33c" is protruded to a position in the optical path of the sensing light from the light emitter 21". The sensing light is transmitted to the light receiver 22" through the light-transmissible aperture 33e. Consequently, the conducting signal is generated. According to a change of the conducting signal from an interrupted status to a generated status, the circuit board 20 generates a corresponding triggering signal.

Please refer to FIG. 4 again. The optical switch keyboard 1 further comprises a keyboard base 5. The keyboard base 5 is disposed under the circuit module 2. The keyboard base 5 further comprises plural light-shading walls 53. Moreover, an accommodation space is defined by the corresponding light-shading walls 53 collaboratively. A light emitter 21 and the corresponding light receiver 22 are accommodated within the accommodation space. Moreover, the light-shading wall 53 has a function of shading the light emitter 21 and the light receiver 22 from the ambient light.

Moreover, since the light emitter 21 and the light receiver 22 are disposed under the circuit board 20, the top side of the circuit board 20 has a reserved space for installing the light source 25. The triggering element 33 has a light-transmissible zone (not shown). A light beam is emitted by the light source 25, which is disposed on the top surface 20a of the circuit board 20. After the light beam is transmitted through the light-transmissible zone of the triggering element, the light beam is irradiated on a bottom surface of the keycap 31. Consequently, an illuminating function is achieved. In a preferred embodiment, the entire of the triggering element 33 is made of a light-transmissible material. That is, the entire of the triggering element 33 is the light-transmissible zone. Under this circumstance, the light transmittance of the triggering element 33 is optimized.

In an embodiment, the light source 25 is received within the second end 34b of the elastic element 34. Consequently, the light beam from the light source 25 can be propagated upwardly through the triggering element 33.

Figure 13:
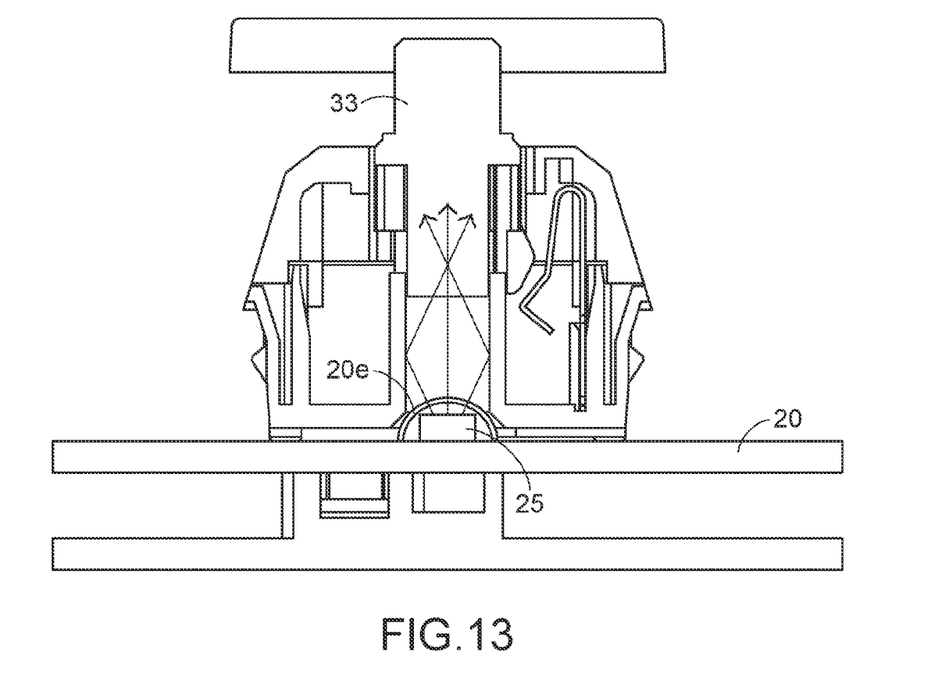
FIG. 13 is a schematic cross-sectional view illustrating an optical switch of an optical keyboard switch according to a fourth embodiment of the present invention, in which the optical switch further comprises a diffusion lens.

It is noted that numerous modifications and alterations may be made while retaining the teachings of the invention. FIG. 13 is a schematic cross-sectional view illustrating an optical switch of an optical keyboard switch according to a fourth embodiment of the present invention, in which the optical switch further comprises a diffusion lens. As shown in FIG. 13, the circuit board 20 further comprises plural diffusion lenses 20e. Each diffusion lens 20e is arranged between the corresponding triggering element 33 and the corresponding light source 25. Moreover, each diffusion lens 20e covers the corresponding light source 25. After the light beam from the light source passes through the diffusion lens 20e, the light beam is uniformly diffused.

From the above descriptions, the present invention provides the optical switch keyboard. In the optical switch keyboard, the light emitter and the light receiver are disposed under the circuit board. By this design, the light emitter and the light receiver are not interfered by the dust, liquid or ambient light coming from the top side. Consequently, the precision of detecting signals will be largely increased. Moreover, in case that the light sources are disposed over the circuit board and the corresponding triggering elements are made of a light-transmissible material, the light beams from the light sources are transmitted through the triggering elements to illuminate the entire of the keyboard.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all modifications and similar structures.

What is claimed is:
1. An optical switch keyboard, comprising:
 a circuit module comprising:
  a circuit board;
  plural light emitters disposed on a bottom surface of the circuit board, wherein each of the plural light emitters emits a sensing light;
  plural light receivers corresponding to the plural light emitters, respectively, wherein the plural light receivers are disposed on the bottom surface of the circuit board, wherein when one of the plural light receivers receives the sensing light from a corresponding light emitter, the light receiver generates a corresponding conducting signal; and
  plural light sources disposed on the circuit board and electrically connected with the circuit board; and
 plural keys corresponding to the plural light emitters, the plural light receivers and the plural light sources, respectively, wherein the plural keys are disposed on a top surface of the circuit board, and each of the plural keys comprises:
a keycap;
a housing disposed under the keycap; and
a triggering element connected with the keycap and penetrating into the housing, wherein the triggering element has a light-transmissible zone, wherein after a light beam from each light source is transmitted through the light-transmissible zone of the triggering element, the light beam is irradiated on a bottom surface of the keycap,
wherein the sensing light from the corresponding light emitter is received by the one of the plural light receivers when the triggering element is in a first position, the sensing light from the corresponding light emitter is not received by the one of the plural light receivers when the triggering element is in a second position, and the circuit board generates a corresponding triggering signal according to a status change of the corresponding conducting signal.

2. The optical switch keyboard according to claim 1, wherein the optical switch keyboard further comprises a keyboard base under the circuit module, and the keyboard base comprises plural light-shading walls that define plural accommodation space to accommodate the plural light emitters and the plural light receiver, and the plural light emitters and the plural light receivers are shaded from ambient light by the light-shading walls, wherein the plural light emitters and the plural light receivers are in communication with the circuit board.

3. The optical switch keyboard according to claim 1, wherein the circuit board comprises plural perforations under the corresponding keys, and the triggering element has a light obstructing part, wherein when the triggering element is moved downwardly, the light obstructing part is protruded through a corresponding perforation to be in an optical path of the sensing light from the light emitter.

4. The optical switch keyboard according to claim 3, wherein when the triggering element is in the first position, the sensing light from the light emitter is received by the light receiver, wherein when the triggering element is in the second position, the light obstructing part is protruded through the corresponding perforation to be in the optical path of the sensing light from the light emitter, so that the sensing light from the light emitter is obstructed by the light obstructing part and not received by the light receiver.

5. The optical switch keyboard according to claim 3, wherein the light obstructing part has a reflective surface, wherein when the triggering element is in the second position, the sensing light from the light emitter is not received by the light receiver, wherein when the triggering element is in the first position, the light obstructing part is protruded through the corresponding perforation to be in the optical path of the sensing light from the light emitter, so that the sensing light from the light emitter is reflected to the light receiver by the reflective surface.

6. The optical switch keyboard according to claim 3, wherein each key further comprises an elastic element, a first end of the elastic element is contacted with the triggering element, and a second end of the elastic element is contacted with the housing, wherein when the keycap is depressed, the triggering element is moved downwardly to the second position, wherein when the keycap is released, the triggering element is returned to the first position in response to an elastic force of the elastic element.

7. The optical switch keyboard according to claim 6, wherein the elastic element is sheathed around a part of the triggering element, and the light source is received in the second end of the elastic element, wherein the light beam from each light source is transmitted upwardly through the light-transmissible zone of the triggering element.

8. The optical switch keyboard according to claim 6, wherein the circuit board further comprises plural diffusion lenses that cover the plural light sources, wherein after the light beam from each light source passes through one of the plural diffusion lens, the light beam is uniformly diffused.

9. The optical switch keyboard according to claim 1, wherein each key comprises at least one positioning post, and the circuit board has plural positioning holes, wherein each key is disposed over a corresponding one of the plural positioning holes, and the at least one positioning post of each key is inserted into the corresponding one of the plural positioning holes of the circuit board so that each key is fixed on the circuit board.

10. The optical switch keyboard according to claim 1, wherein each key further comprises a spring strip, and the spring strip is accommodated within the housing, wherein when the keycap is depressed and the triggering element is moved downwardly, the spring strip is activated to generate a feedback sound and a tactile feel.

11. The optical switch keyboard according to claim 1, wherein the light sources are disposed on the top surface of the circuit board, or the light sources are disposed on the bottom surface of the circuit board.

\* \* \* \* \*